United States Patent
Koyanagi et al.

(10) Patent No.: US 9,793,166 B2
(45) Date of Patent: Oct. 17, 2017

(54) LIFT-OFF METHOD

(71) Applicant: DISCO CORPORATION, Tokyo (JP)

(72) Inventors: Tasuku Koyanagi, Tokyo (JP); Noboru Takeda, Tokyo (JP); Hiroshi Morikazu, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 345 days.

(21) Appl. No.: 14/716,149

(22) Filed: May 19, 2015

(65) Prior Publication Data

US 2015/0328872 A1 Nov. 19, 2015

(30) Foreign Application Priority Data

May 19, 2014 (JP) .................................. 2014-103522

(51) Int. Cl.
*B32B 37/00* (2006.01)
*H01L 21/78* (2006.01)
(Continued)

(52) U.S. Cl.
CPC ............ *H01L 21/78* (2013.01); *B23K 20/002* (2013.01); *B23K 20/10* (2013.01);
(Continued)

(58) Field of Classification Search
CPC . H01L 21/78; H01L 21/6835; H01L 33/0079; B23K 26/0624; B23K 26/50;
(Continued)

(56) References Cited

U.S. PATENT DOCUMENTS 9,531,154 B2 * 12/2016 Koyanagi ........... H01L 33/0079
2003/0087476 A1   5/2003 Oohata et al.
(Continued)

FOREIGN PATENT DOCUMENTS

JP   10-305420     11/1998
JP   2004-72052    3/2004
(Continued)

OTHER PUBLICATIONS

U.S. Appl. No. 14/606,488, filed Jan. 27, 2015.
U.S. Appl. No. 14/612,732, filed Feb. 3, 2015.
U.S. Appl. No. 14/798,011, filed Jul. 13, 2015.

*Primary Examiner* — James Sells
(74) *Attorney, Agent, or Firm* — Greer Burns & Crain, Ltd.

(57) ABSTRACT

A lift-off method for transferring an optical device layer in an optical device wafer to a transfer substrate, the optical device layer being formed on the front side of an epitaxy substrate through a buffer layer. A transfer substrate is bonded through a bonding layer to the front side of the optical device layer of the optical device wafer, thereby forming a composite substrate. A pulsed laser beam having a wavelength transmissive to the epitaxy substrate and absorptive to the buffer layer is applied from the back side of the epitaxy substrate to the buffer layer, thereby breaking the buffer layer, and the epitaxy substrate is peeled from the optical device layer, thereby transferring the optical device layer to the transfer substrate. Ultrasonic vibration is applied to the composite substrate in transferring the optical device layer.

11 Claims, 10 Drawing Sheets

(51) Int. Cl.
*H01L 21/683* (2006.01)
*H01L 33/00* (2010.01)
*B32B 43/00* (2006.01)
*B23K 20/00* (2006.01)
*B23K 20/10* (2006.01)
*B23K 26/08* (2014.01)
*B23K 26/50* (2014.01)
*B23K 26/0622* (2014.01)
*B23K 101/40* (2006.01)
*B23K 103/16* (2006.01)
*B23K 103/00* (2006.01)

(52) U.S. Cl.
CPC ...... *B23K 26/0624* (2015.10); *B23K 26/0853* (2013.01); *B23K 26/50* (2015.10); *B32B 37/025* (2013.01); *B32B 43/006* (2013.01); *H01L 21/6835* (2013.01); *H01L 33/0079* (2013.01); *B23K 2201/40* (2013.01); *B23K 2203/172* (2015.10); *B23K 2203/56* (2015.10); *B32B 2307/40* (2013.01); *B32B 2310/028* (2013.01); *B32B 2310/0409* (2013.01); *B32B 2310/0843* (2013.01); *B32B 2551/00* (2013.01); *H01L 2221/6839* (2013.01); *H01L 2221/68363* (2013.01)

(58) Field of Classification Search
CPC .. B23K 20/002; B23K 20/10; B23K 26/0853; B32B 37/025; B32B 43/006
USPC ........................................................ 156/73.1
See application file for complete search history.

(56) References Cited

U.S. PATENT DOCUMENTS

| | | |
|---|---|---|
| 2007/0275544 A1 | 11/2007 | Maki |
| 2009/0053845 A1 | 2/2009 | Wong et al. |
| 2009/0253273 A1 | 10/2009 | Sano et al. |
| 2012/0095584 A1 | 4/2012 | Ando et al. |
| 2012/0168911 A1 | 7/2012 | Chen et al. |
| 2013/0017640 A1* | 1/2013 | Morikazu ............. B23K 26/00 438/46 |
| 2013/0065010 A1 | 3/2013 | Hayashi et al. |

FOREIGN PATENT DOCUMENTS

| | | |
|---|---|---|
| JP | 2011-103361 | 5/2011 |
| JP | 2011093803 | 5/2011 |

* cited by examiner

LIFT-OFF METHOD

BACKGROUND OF THE INVENTION

Field of the Invention

The present invention relates to a lift-off method for transferring an optical device layer in an optical device wafer to a transfer substrate, the optical device layer being formed on the front side of an epitaxy substrate such as a sapphire substrate and a silicon carbide substrate through a buffer layer.

Description of the Related Art

In an optical device fabrication process, an optical device layer composed of an n-type semiconductor layer and a p-type semiconductor layer is formed on the front side of a substantially disk-shaped epitaxy substrate such as a sapphire substrate and a silicon carbide substrate through a buffer layer. The optical device layer is formed of GaN (gallium nitride), for example. The optical device layer is partitioned by a plurality of crossing streets into a plurality of regions where a plurality of optical devices such as light emitting diodes and laser diodes are formed, thus constituting an optical device wafer. The optical device wafer is divided along the streets to thereby obtain the individual optical devices (see Japanese Patent Laid-open No. Hei 10-305420, for example).

Further, for the purpose of improving the luminance of an optical device, Japanese Patent Laid-open No. 2004-72052 discloses a manufacturing method called lift-off for transferring the optical device layer of the optical device wafer to a transfer substrate formed of Mo (molybdenum), Cu (copper), or Si (silicon), for example. The above-mentioned lift-off includes the steps of bonding the transfer substrate through a bonding layer formed of Au—Sn (gold tin alloy), for example, to the optical device layer of the optical device wafer, next applying a laser beam having a wavelength transmissive to the epitaxy substrate and absorptive to the buffer layer from the back side of the epitaxy substrate to the buffer layer, thereby breaking the buffer layer, and next peeling the epitaxy substrate from the optical device layer to thereby transfer the optical device layer to the transfer substrate.

SUMMARY OF THE INVENTION

However, in applying the laser beam from the back side of the epitaxy substrate to the buffer layer in the condition where the focal point of the laser beam is set in the buffer layer, thereby breaking the buffer layer, there is a case that the buffer layer cannot be sufficiently broken, causing a problem such that the epitaxy substrate cannot be smoothly peeled off.

Further, in the case that a plurality of microscopic asperities are formed on the front side of the epitaxy substrate, so as to improve the quality of each optical device, there is another problem such that although the buffer layer is broken by the application of the laser beam, the peeling of the epitaxy substrate is difficult due to the plural microscopic asperities formed on the front side of the epitaxy substrate.

It is therefore an object of the present invention to provide a lift-off method which can smoothly peel the epitaxy substrate even in the case that the buffer layer cannot be sufficiently broken.

In accordance with an aspect of the present invention, there is provided a lift-off method for transferring an optical device layer in an optical device wafer to a transfer substrate, the optical device layer being formed on the front side of an epitaxy substrate through a buffer layer, the lift-off method including a transfer substrate bonding step of bonding the transfer substrate through a bonding layer to the front side of the optical device layer of the optical device wafer, thereby forming a composite substrate; a buffer layer breaking step of applying a pulsed laser beam having a wavelength transmissive to the epitaxy substrate and absorptive to the buffer layer from the back side of the epitaxy substrate to the buffer layer after performing the transfer substrate bonding step, thereby breaking the buffer layer; and an optical device layer transferring step of peeling the epitaxy substrate from the optical device layer after performing the buffer layer breaking step, thereby transferring the optical device layer to the transfer substrate; wherein ultrasonic vibration is applied to the composite substrate in performing the optical device layer transferring step.

Preferably, the optical device layer transferring step includes the steps of applying ultrasonic vibration to at least one of the epitaxy substrate and the transfer substrate constituting the composite substrate; inserting a wedge into the buffer layer present at the boundary between the epitaxy substrate and the transfer substrate; and peeling the epitaxy substrate from the optical device layer to thereby transfer the optical device layer to the transfer substrate.

Preferably, the optical device layer transferring step includes the steps of applying first ultrasonic vibration to at least one of the epitaxy substrate and the transfer substrate constituting the composite substrate; inserting a wedge into the buffer layer present at the boundary between the epitaxy substrate and the transfer substrate; applying second ultrasonic vibration to the wedge; and peeling the epitaxy substrate from the optical device layer to thereby transfer the optical device layer to the transfer substrate. Preferably, the frequency of the first ultrasonic vibration is set different from the frequency of the second ultrasonic vibration.

Preferably, the optical device layer transferring step includes the steps of inserting a wedge into the buffer layer present at the boundary between the epitaxy substrate and the transfer substrate constituting the composite substrate; applying ultrasonic vibration to the wedge; and peeling the epitaxy substrate from the optical device layer to thereby transfer the optical device layer to the transfer substrate.

Preferably, the optical device layer transferring step includes the steps of inserting a wedge into the buffer layer present at the boundary between the epitaxy substrate and the transfer substrate constituting the composite substrate, the wedge having a fine hole opening to the front end of the wedge; issuing a jet of air from the front opening of the fine hole of the wedge; applying ultrasonic vibration to the wedge; and peeling the epitaxy substrate from the optical device layer to thereby transfer the optical device layer to the transfer substrate.

Preferably, the optical device layer transferring step includes the steps of inserting a wedge into the buffer layer present at the boundary between the epitaxy substrate and the transfer substrate constituting the composite substrate, the wedge having a fine hole opening to the front end of the wedge; issuing a jet of water from the front opening of the fine hole of the wedge; applying ultrasonic vibration to the wedge; and peeling the epitaxy substrate from the optical device layer to thereby transfer the optical device layer to the transfer substrate.

Preferably, the optical device layer transferring step includes the steps of immersing the composite substrate in water; applying ultrasonic vibration to the composite substrate; and peeling the epitaxy substrate from the optical device layer to thereby transfer the optical device layer to the transfer substrate.

Preferably, the optical device layer transferring step includes the steps of heating the composite substrate; applying ultrasonic vibration to at least one of the epitaxy substrate and the transfer substrate constituting the composite substrate; and peeling the epitaxy substrate from the optical device layer to thereby transfer the optical device layer to the transfer substrate.

Preferably the optical device layer transferring step includes the steps of applying first ultrasonic vibration to the epitaxy substrate constituting the composite substrate; applying second ultrasonic vibration to the transfer substrate constituting the composite substrate; and peeling the epitaxy substrate from the optical device layer to thereby transfer the optical device layer to the transfer substrate. Preferably, the frequency of the first ultrasonic vibration is set different from the frequency of the second ultrasonic vibration.

As described above, the lift-off method of the present invention includes the transfer substrate bonding step of bonding the transfer substrate through the bonding layer to the front side of the optical device layer of the optical device wafer, thereby forming the composite substrate; the buffer layer breaking step of applying the pulsed laser beam having a wavelength transmissive to the epitaxy substrate and absorptive to the buffer layer from the back side of the epitaxy substrate to the buffer layer after performing the transfer substrate bonding step, thereby breaking the buffer layer; and the optical device layer transferring step of peeling the epitaxy substrate from the optical device layer after performing the buffer layer breaking step, thereby transferring the optical device layer to the transfer substrate, wherein ultrasonic vibration is applied to the composite substrate in performing the optical device layer transferring step. Accordingly, even in the case that the buffer layer is not sufficiently broken in the buffer layer breaking step, the epitaxy substrate can be easily peeled from the optical device layer to thereby transfer the optical device layer to the transfer substrate.

Further, also even in the case that a plurality of microscopic asperities are formed on the front side of the epitaxy substrate, so as to improve the quality of each optical device, the epitaxy substrate can be easily peeled from the optical device layer to thereby transfer the optical device layer to the transfer substrate because ultrasonic vibration is applied to the composite substrate in performing the optical device layer transferring step.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
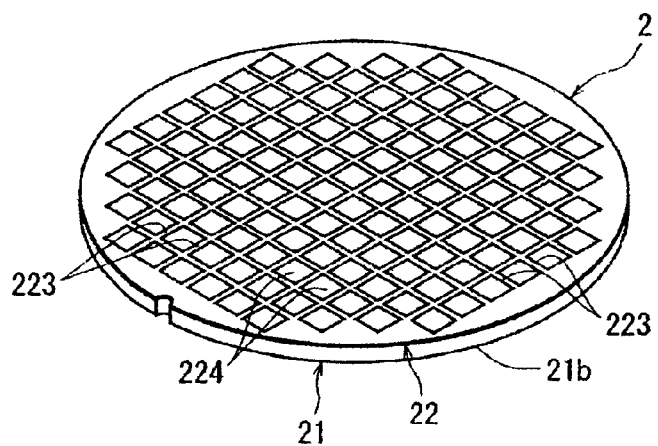
FIG. 1A is a perspective view of an optical device wafer having an optical device layer.

Preferred embodiments of the lift-off method according to the present invention will now be described in detail with reference to the attached drawings. FIG. 1A is a perspective view of an optical device wafer 2 having an optical device layer to be transferred to a transfer substrate by the lift-off method according to the present invention, and FIG. 1B is an enlarged sectional view of an essential part of the optical device wafer 2 shown in FIG. 1A.

Figure 1B:
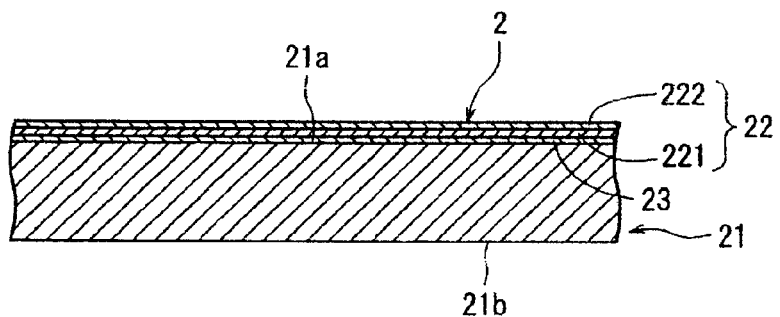
FIG. 1B is an enlarged sectional view of an essential part of the optical device wafer shown in FIG. 1A.

The optical device wafer 2 shown in FIGS. 1A and 1B is formed by epitaxial growth of an optical device layer 22 on the front side 21a of a circular epitaxy substrate 21. The epitaxy substrate 21 is formed from a sapphire substrate. The epitaxy substrate 21 has a diameter of 50 mm and a thickness of 600 µm, for example. The optical device layer 22 is composed of an n-type gallium nitride semiconductor layer 221 and a p-type gallium nitride semiconductor layer 222. In forming the optical device layer 22 composed of the n-type gallium nitride semiconductor layer 221 and the p-type gallium nitride semiconductor layer 222 on the front side 21a of the epitaxy substrate 21 by epitaxial growth, a buffer layer 23 of gallium nitride (GaN) is formed between the front side 21a of the epitaxy substrate 21 and the n-type gallium nitride semiconductor layer 221 forming the optical device layer 22. The buffer layer 23 has a thickness of 1 µm, for example, and the optical device layer 22 has a thickness of 10 µm, for example. As shown in FIG. 1A, the optical device layer 22 is partitioned by a plurality of crossing streets 223 to define a plurality of regions where a plurality of optical devices 224 are formed.

Figure 2A:
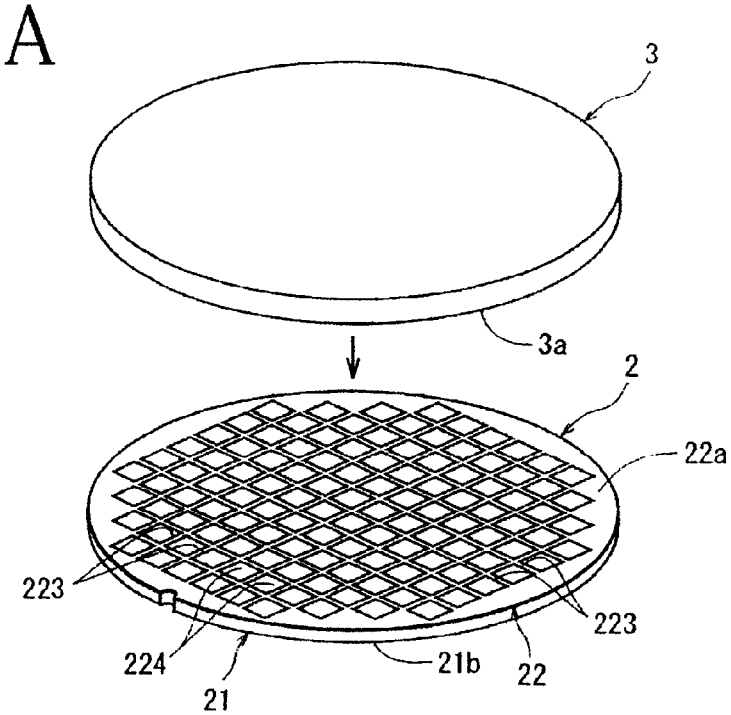
FIGS. 2A to 2C are views for illustrating a transfer substrate bonding step in the present invention.
Figure 2B:
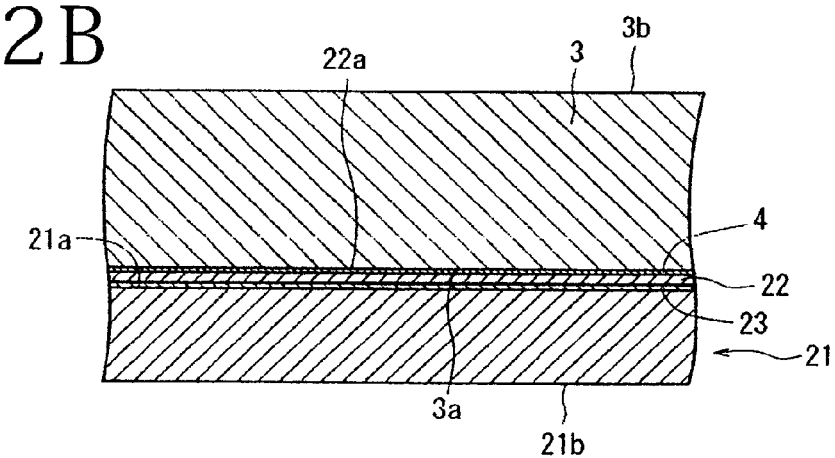
Figure 2C:
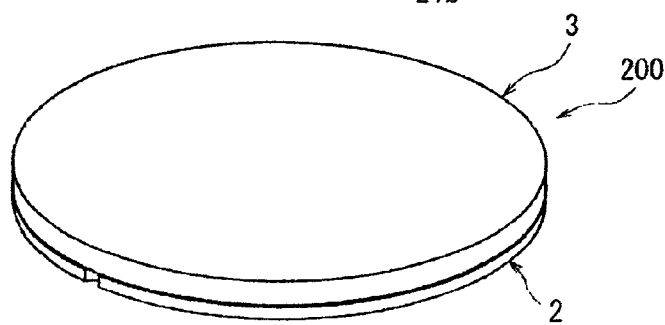

To peel the epitaxy substrate 21 from the optical device layer 22 in the optical device wafer 2 and transfer the optical device layer 22 to a transfer substrate, a transfer substrate bonding step is first performed in such a manner that the transfer substrate is bonded to the front side 22a of the optical device layer 22. More specifically, as shown in FIGS. 2A to 2C, a transfer substrate 3 having a thickness of 1 mm, for example, is bonded through a bonding layer 4 to the front side 22a of the optical device layer 22 formed on the front side 21a of the epitaxy substrate 21 constituting the optical device wafer 2. In this preferred embodiment, the transfer substrate 3 is formed of copper (Cu), and the bonding layer 4 is formed of gold tin alloy (Au—Sn). As other examples, the transfer substrate 3 may be formed of molybdenum (Mo) or silicon (Si), and the bonding layer 4 may be formed of gold (Au), platinum (Pt), chromium (Cr), indium (In), or palladium (Pd) as a bonding material. This transfer substrate bonding step is performed in the following manner. The bonding material mentioned above is deposited by evaporation to the front side 22a of the optical device layer 22 formed on the front side 21a of the epitaxy substrate 21 or to the front side 3a of the transfer substrate 3, thereby forming the bonding layer 4 having a thickness of about 3 µm. Thereafter, the bonding layer 4 is brought into pressure contact with the front side 3a of the transfer substrate 3 or the front side 22a of the optical device layer 22, thereby bonding the front side 3a of the transfer substrate 3 through the bonding layer 4 to the front side 22a of the optical device layer 22 constituting the optical device wafer 2. As a result, a composite substrate 200 is formed as shown in FIG. 2C.

After performing the transfer substrate bonding step to bond the front side 3a of the transfer substrate 3 through the bonding layer 4 to the front side 22a of the optical device layer 22 of the optical device wafer 2 and thereby form the composite substrate 200 as mentioned above, a buffer layer breaking step is performed in such a manner that a pulsed laser beam having a wavelength transmissive to the epitaxy substrate 21 and absorptive to the buffer layer 23 is applied to the buffer layer 23 from the back side 21b of the epitaxy substrate 21 constituting the composite substrate 200, thereby breaking the buffer layer 23. This buffer layer breaking step is performed by using a laser processing apparatus 5 shown in FIG. 3. The laser processing apparatus 5 shown in FIG. 3 includes a chuck table 51 for holding a workpiece and laser beam applying means 52 for applying a laser beam to the workpiece held on the chuck table 51. The chuck table 51 is so configured as to hold the workpiece under suction. The chuck table 51 is movable both in a feeding direction shown by an arrow X in FIG. 3 by feeding means (not shown) and in an indexing direction shown by an arrow Y in FIG. 3 by indexing means (not shown).

The laser beam applying means 52 includes a cylindrical casing 521 extending in a substantially horizontal direction. Although not shown, the casing 521 contains pulsed laser beam oscillating means including a pulsed laser beam oscillator and repetition frequency setting means. The laser beam applying means 52 further includes focusing means 522 mounted on the front end of the casing 521 for focusing a pulsed laser beam oscillated from the pulsed laser beam oscillating means. The laser beam applying means 52 is provided with focal position adjusting means (not shown) for adjusting the focal position of the pulsed laser beam to be focused by the focusing means 522.

Figure 3:
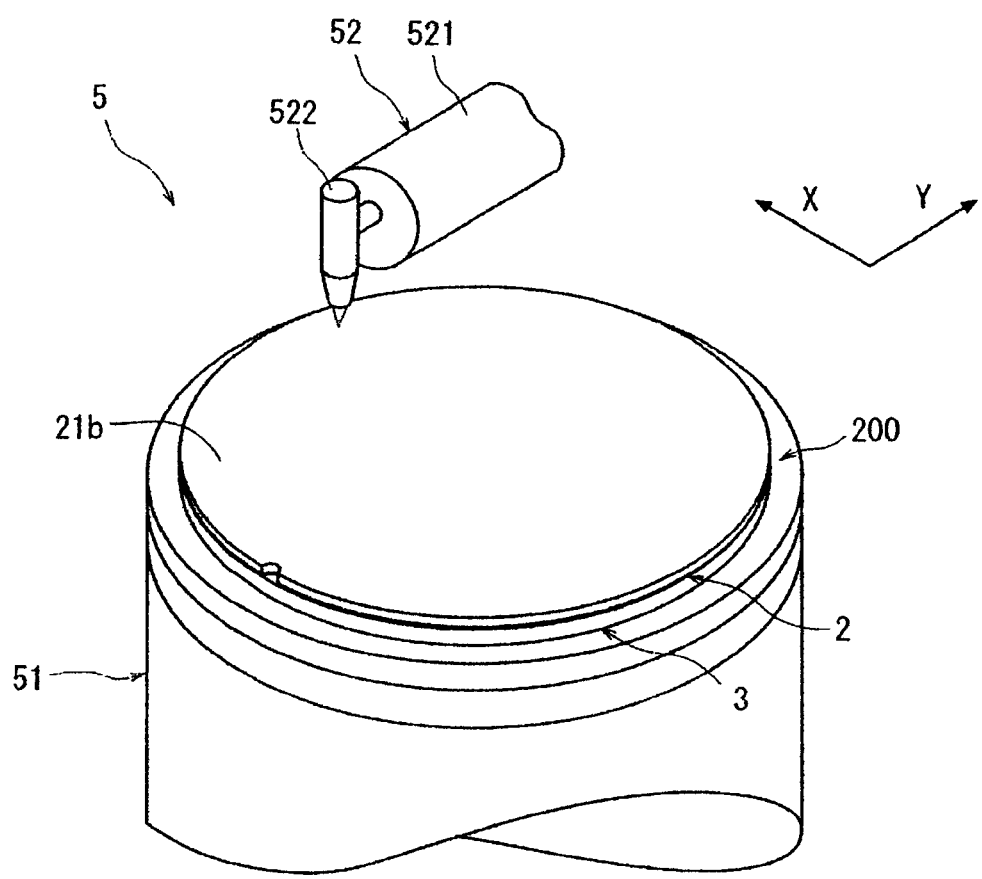
FIG. 3 is a perspective view of a laser processing apparatus for performing a buffer layer breaking step in the present invention.
Figure 4A:
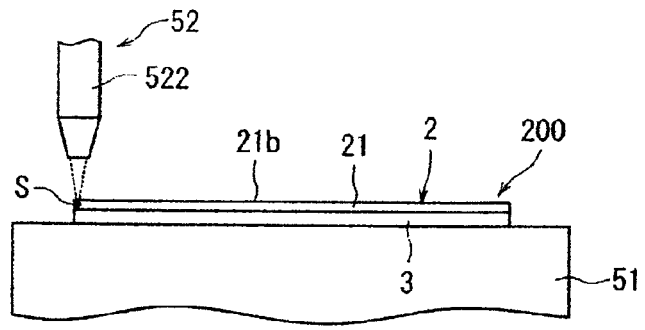
FIGS. 4A to 4C are views for illustrating the buffer layer breaking step.
Figure 4B:
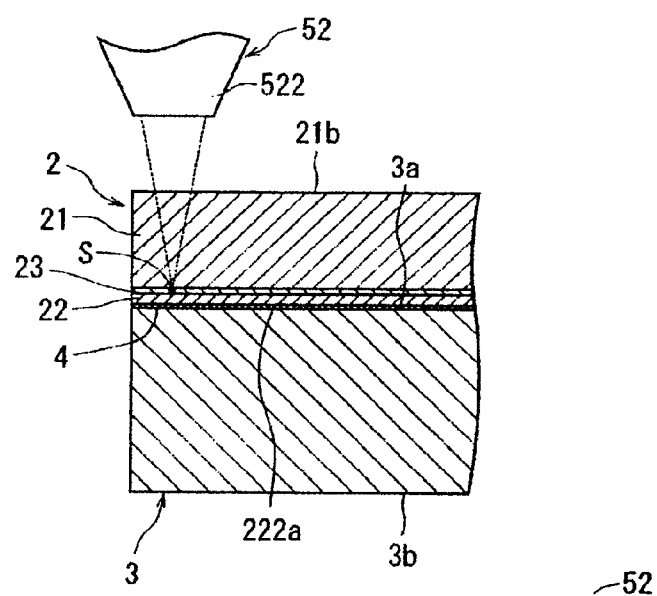
Figure 4C:
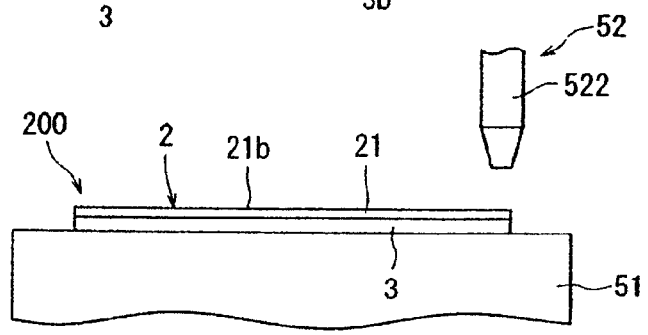

In performing the buffer layer breaking step by using the laser processing apparatus 5 mentioned above, the transfer substrate 3 of the composite substrate 200 is placed on the upper surface (holding surface) of the chuck table 51 as shown in FIG. 3. Thereafter, suction means (not shown) connected to the chuck table 51 is operated to hold the composite substrate 200 on the chuck table 51 under suction (wafer holding step). Accordingly, the composite substrate 200 is held on the chuck table 51 under suction in the condition where the back side 21b of the epitaxy substrate 21 of the optical device wafer 2 is oriented upward. After performing the wafer holding step mentioned above, the feeding means (not shown) is operated to move the chuck table 51 to a laser beam applying area below the focusing means 522 of the laser beam applying means 52 so that one end (left end as viewed in FIG. 4A) of the epitaxy substrate 21 of the optical device wafer 2 constituting the composite substrate 200 held on the chuck table 51 is positioned directly below the focusing means 522 of the laser beam applying means 52 as shown in FIG. 4A. Thereafter, the defocused spot (S) of the pulsed laser beam to be applied from the focusing means 522 is set in the buffer layer 23 as shown in FIG. 4B. Thereafter, the laser beam applying means 52 is operated to apply the pulsed laser beam from the focusing means 522 to the buffer layer 23. At the same time, the chuck table 51 is moved in the direction shown by an arrow X1 in FIG. 4A at a predetermined feed speed. When the other end (right end as viewed in FIG. 4C) of the epitaxy substrate 21 reaches the position directly below the focusing means 522 of the laser beam applying means 52 as shown in FIG. 4C, the application of the pulsed laser beam is stopped and the movement of the chuck table 51 is also stopped. This buffer layer breaking step is repeatedly performed over the entire surface of the buffer layer 23.

As a modification, the buffer layer breaking step may be performed in the following manner. First, the focusing means 522 is positioned directly above the outer circumference of the epitaxy substrate 21 as shown in FIG. 4A. Thereafter, the pulsed laser beam is applied from the focusing means 522 and the focusing means 522 is moved toward the center of the chuck table 51 as rotating the chuck table 51, thereby applying the pulsed laser beam over the entire surface of the buffer layer 23.

For example, the buffer layer breaking step mentioned above is performed under the following processing conditions.

Figure 5A:
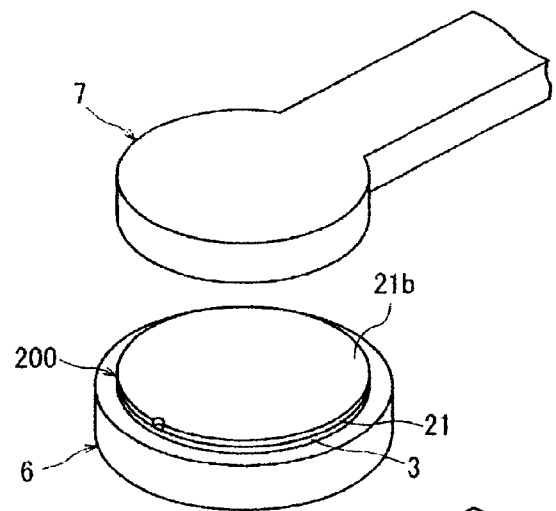
FIGS. 5A to 5C are perspective views for illustrating a first preferred embodiment of an optical device layer transferring step in the present invention.
Figure 5B:
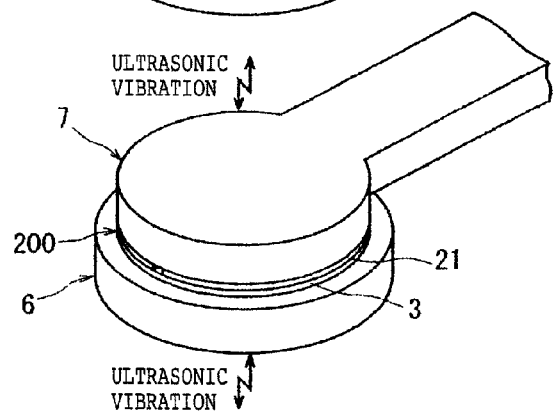

Light source: YAG laser
Wavelength: 257 nm
Repetition frequency: 50 kHz
Average power: 0.12 W
Pulse width: 100 ps
Spot diameter: 70 µm
Defocus: 1.0 (In the condition where the focal point of the laser beam is set on the back side 21b of the epitaxy substrate 21, the focusing means 522 is moved toward the epitaxy substrate 21 by 1 mm.)
Work feed speed: 600 mm/second After performing the buffer layer breaking step mentioned above, an optical device layer transferring step is performed in such a manner that the epitaxy substrate 21 of the composite substrate 200 is peeled from the optical device layer 22 to thereby transfer the optical device layer 22 to the transfer substrate 3. A first preferred embodiment of the optical device layer transferring step will now be described with reference to FIGS. 5A to 5C. The transfer substrate 3 of the composite substrate 200 processed by the buffer layer breaking step is placed on a holding table 6 as shown in FIG. 5A, and suction means (not shown) connected to the holding table 6 is operated to hold the composite substrate 200 on the holding table 6 under suction. Accordingly, the composite substrate 200 is held on the holding table 6 under suction in the condition where the back side 21b of the epitaxy substrate 21 is oriented upward as shown in FIG. 5A. Thereafter, the lower surface (suction holding surface) of a suction pad 7 is placed on the back side 21b of the epitaxy substrate 21 of the composite substrate 200 held on the holding table 6 under suction as shown in FIG. 5B, and suction means (not shown) connected to the suction pad 7 is operated to hold the back side 21b of the epitaxy substrate 21 onto the lower surface (suction holding surface) of the suction pad 7 under suction. Thereafter, ultrasonic vibration applying means (not shown) provided in the holding table 6 is operated to apply ultrasonic vibration to the back side 3b of the transfer substrate 3. At the same time, ultrasonic vibration applying means (not shown) provided in the suction pad 7 is operated to apply ultrasonic vibration to the back side 21b of the epitaxy substrate 21.

Figure 5C:
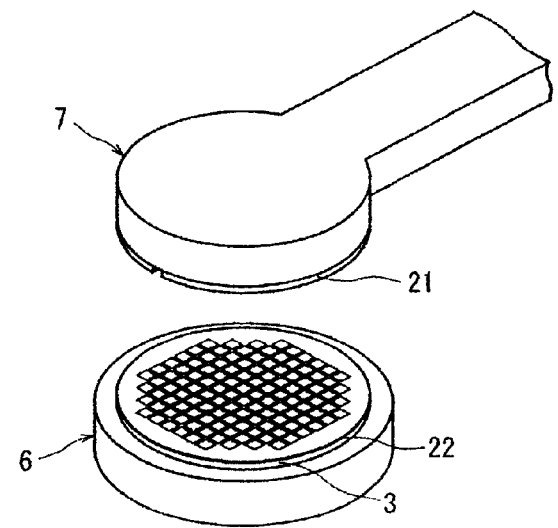

Thereafter, the suction pad 7 holding the epitaxy substrate 21 under suction is moved (lifted) away from the holding table 6 holding the transfer substrate 3 under suction to thereby peel off the epitaxy substrate 21 as shown in FIG. 5C. The frequency of the ultrasonic vibration to be applied to both of the back side 3b of the transfer substrate 3 and the back side 21b of the epitaxy substrate 21 is set to 20 kHz, for example. In this manner, ultrasonic vibration is applied to the composite substrate 200 and the suction pad 7 is then moved away from the holding table 6. Accordingly, even in the case that the buffer layer 23 is not sufficiently broken in the buffer layer breaking step, the epitaxy substrate 21 can be easily peeled from the optical device layer 22 to thereby transfer the optical device layer 22 to the transfer substrate 3 as shown in FIG. 5C. While ultrasonic vibration is applied to both of the back side 3b of the transfer substrate 3 and the back side 21b of the epitaxy substrate 21 in the first preferred embodiment, ultrasonic vibration may be applied to either the back side 3b of the transfer substrate 3 or the back side 21b of the epitaxy substrate 21.

Figure 6A:
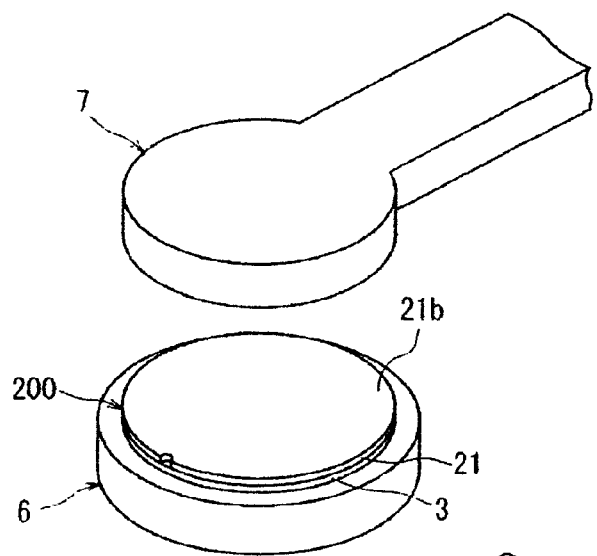
FIGS. 6A to 6C are perspective views for illustrating a second preferred embodiment of the optical device layer transferring step.
Figure 6B:
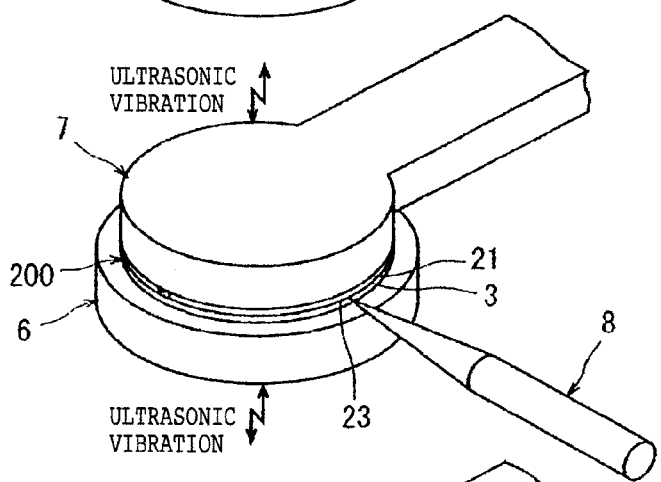

A second preferred embodiment of the optical device layer transferring step will now be described with reference to FIGS. 6A to 6C. As in the first preferred embodiment mentioned above, the transfer substrate 3 of the composite substrate 200 processed by the buffer layer breaking step is placed on a holding table 6 as shown in FIG. 6A, and suction means (not shown) connected to the holding table 6 is operated to hold the composite substrate 200 on the holding table 6 under suction. Thereafter, the lower surface (suction holding surface) of a suction pad 7 is placed on the back side 21b of the epitaxy substrate 21 of the composite substrate 200 held on the holding table 6 under suction as shown in FIG. 6B, and suction means (not shown) connected to the suction pad 7 is operated to hold the back side 21b of the epitaxy substrate 21 onto the lower surface (suction holding surface) of the suction pad 7 under suction. Thereafter, ultrasonic vibration applying means (not shown) provided in the holding table 6 is operated to apply ultrasonic vibration to the back side 3b of the transfer substrate 3. At the same time, ultrasonic vibration applying means (not shown) provided in the suction pad 7 is operated to apply ultrasonic vibration to the back side 21b of the epitaxy substrate 21.

Figure 6C:
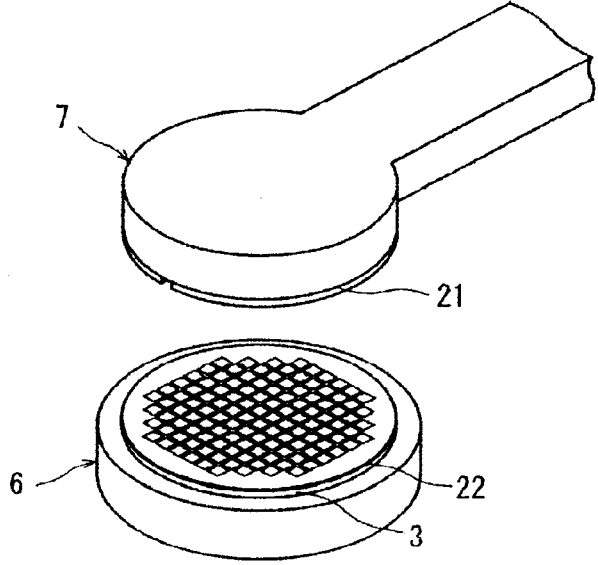

Thereafter, a wedge 8 is inserted into the buffer layer 23 present at the boundary between the epitaxy substrate 21 and the transfer substrate 3 as shown in FIG. 6B, and the suction pad 7 is moved away from the holding table 6 as shown in FIG. 6C. The frequency of the ultrasonic vibration to be applied to both of the back side 3b of the transfer substrate 3 and the back side 21b of the epitaxy substrate 21 is set to 20 kHz, for example. In this manner, ultrasonic vibration is applied to the composite substrate 200 and the wedge 8 is inserted into the buffer layer 23 present at the boundary between the epitaxy substrate 21 and the transfer substrate 3. Then, the suction pad 7 is moved away from the holding table 6. Accordingly, even in the case that the buffer layer 23 is not sufficiently broken in the buffer layer breaking step, the epitaxy substrate 21 can be easily peeled from the optical device layer 22 to thereby transfer the optical device layer 22 to the transfer substrate 3 as shown in FIG. 6C. While ultrasonic vibration is applied to both of the back side 3b of the transfer substrate 3 and the back side 21b of the epitaxy substrate 21 in the second preferred embodiment, ultrasonic vibration may be applied to either the back side 3b of the transfer substrate 3 or the back side 21b of the epitaxy substrate 21.

Figure 7:
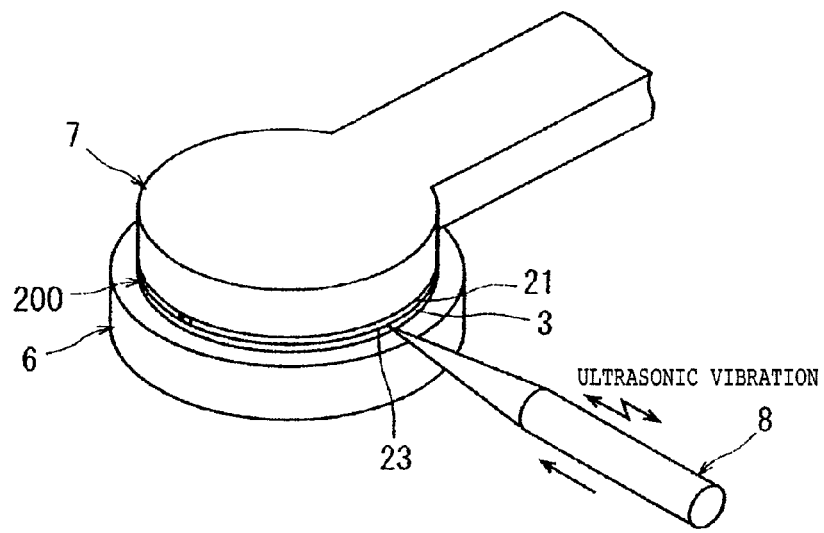
FIG. 7 is a perspective view for illustrating a third preferred embodiment of the optical device layer transferring step.

A third preferred embodiment of the optical device layer transferring step will now be described with reference to FIG. 7. As in the first preferred embodiment mentioned above, the transfer substrate 3 of the composite substrate 200 processed by the buffer layer breaking step is placed on a holding table 6, and suction means (not shown) connected to the holding table 6 is operated to hold the composite substrate 200 on the holding table 6 under suction. Thereafter, the lower surface (suction holding surface) of a suction pad 7 is placed on the back side 21b of the epitaxy substrate 21 of the composite substrate 200 held on the holding table 6 under suction, and suction means (not shown) connected to the suction pad 7 is operated to hold the back side 21b of the epitaxy substrate 21 onto the lower surface (suction holding surface) of the suction pad 7 under suction. Thereafter, a wedge 8 is inserted into the buffer layer 23 present at the boundary between the epitaxy substrate 21 and the transfer substrate 3, and ultrasonic vibration is applied to the wedge 8. Accordingly, the effect of peeling off the epitaxy substrate 21 can be improved.

Figure 8:
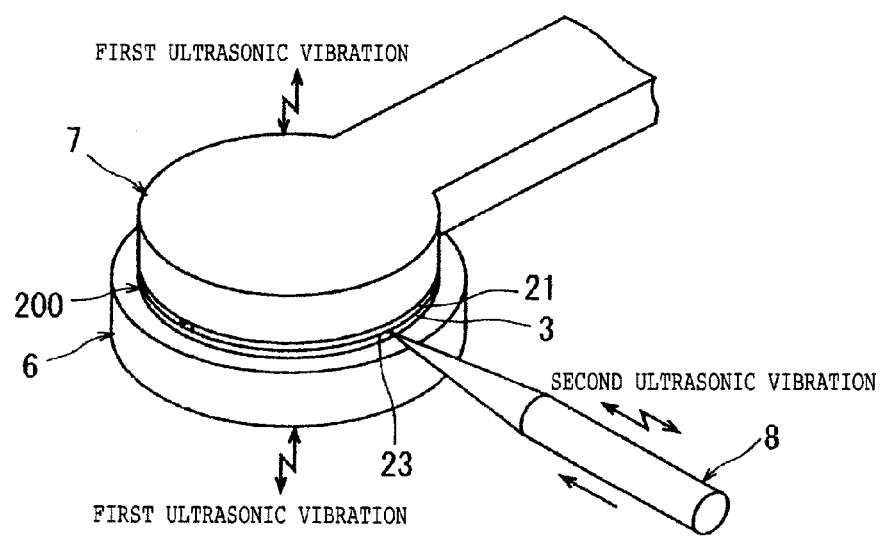
FIG. 8 is a perspective view for illustrating a fourth preferred embodiment of the optical device layer transferring step.

A fourth preferred embodiment of the optical device layer transferring step will now be described with reference to FIG. 8. The fourth preferred embodiment shown in FIG. 8 is similar to the third preferred embodiment shown in FIG. 7 with the exception that first ultrasonic vibration is applied to the back side 3b of the transfer substrate 3 and/or the back side 21b of the epitaxy substrate 21 and second ultrasonic vibration is applied to the wedge 8 inserted into the buffer layer 23 present at the boundary between the epitaxy substrate 21 and the transfer substrate 3. Preferably, the frequency of the first ultrasonic vibration to be applied to the back side 3b of the transfer substrate 3 and/or the back side 21b of the epitaxy substrate 21 is different from the frequency of the second ultrasonic vibration to be applied to the wedge 8. For example, the frequency of the first ultrasonic vibration to be applied to the back side 3b of the transfer substrate 3 and/or the back side 21b of the epitaxy substrate 21 is set to 20 kHz, whereas the frequency of the second ultrasonic vibration to be applied to the wedge 8 is set to 32 kHz. In this manner, the frequency of the first ultrasonic vibration to be applied to the back side 3b of the transfer substrate 3 and/or the back side 21b of the epitaxy substrate 21 is set different from the frequency of the second ultrasonic vibration to be applied to the wedge 8, thereby further improving the effect of peeling off the epitaxy substrate 21.

Figure 9:
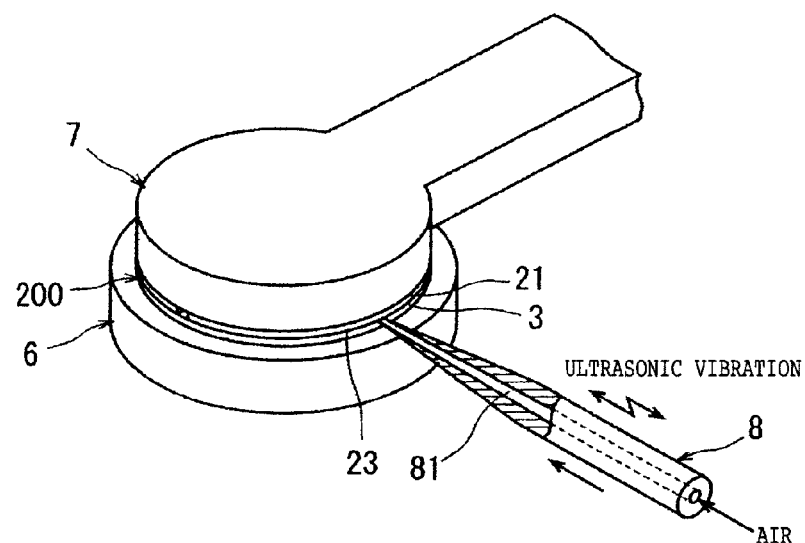
FIG. 9 is a perspective view for illustrating a fifth preferred embodiment of the optical device layer transferring step.

A fifth preferred embodiment of the optical device layer transferring step will now be described with reference to FIG. 9. The fifth preferred embodiment shown in FIG. 9 is similar to the third preferred embodiment shown in FIG. 7 with the exception that the wedge 8 has a fine hole 81 opening to the front end of the wedge 8 and a jet of air is issued from the front opening of the fine hole 81 of the wedge 8 into the buffer layer 23.

Figure 10:
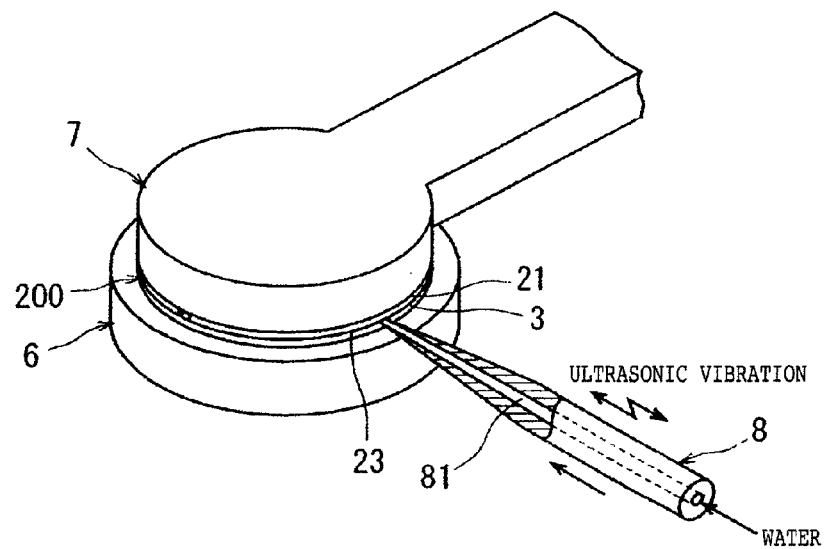
FIG. 10 is a perspective view for illustrating a sixth preferred embodiment of the optical device layer transferring step.

A sixth preferred embodiment of the optical device layer transferring step will now be described with reference to FIG. 10. The sixth preferred embodiment shown in FIG. 10 is similar to the fifth preferred embodiment shown in FIG.

9 with the exception that a jet of water is issued from the front opening of the fine hole 81 of the wedge 8 into the buffer layer 23.

Figure 11:
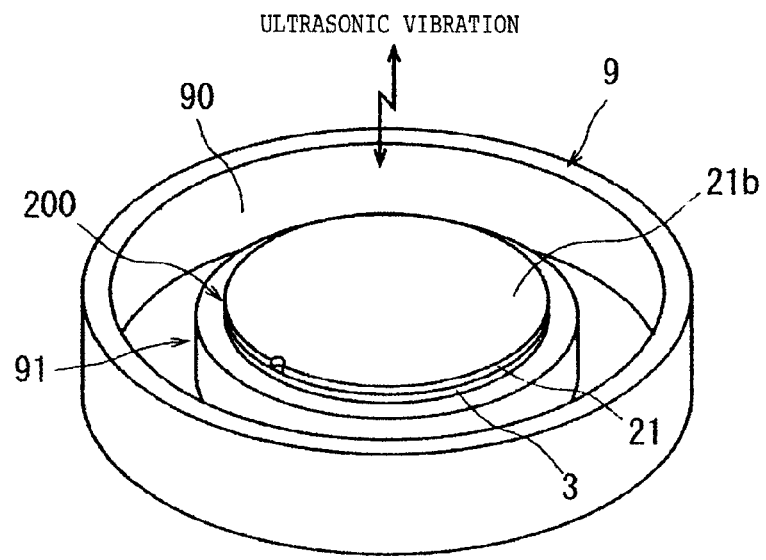
FIG. 11 is a perspective view for illustrating a seventh preferred embodiment of the optical device layer transferring step.

A seventh of the optical device layer transferring step will now be described with reference to FIG. 11. In the seventh preferred embodiment shown in FIG. 11, the transfer substrate 3 of the composite substrate 200 processed by the buffer layer breaking step is placed on a holding table 91 provided in a water tank 9, and suction means (not shown) connected to the holding table 91 is operated to hold the composite substrate 200 on the holding tale 91 under suction. Accordingly, the composite substrate 200 is held on the holding table 91 under suction in the condition where the back side 21b of the epitaxy substrate 21 is oriented upward. Thereafter, the water tank 9 is filled with water 90 to immerse the composite substrate 200 in the water 90, and ultrasonic vibration applying means (not shown) provided in the holding table 91 is operated to apply ultrasonic vibration to the back side 3b of the transfer substrate 3. Thereafter, any peeling means such as a suction pad similar to the suction pad 7 mentioned above is used to peel the epitaxy substrate 21 from the optical device layer 22, thereby transferring the optical device layer 22 to the transfer substrate 3.

Figure 12:
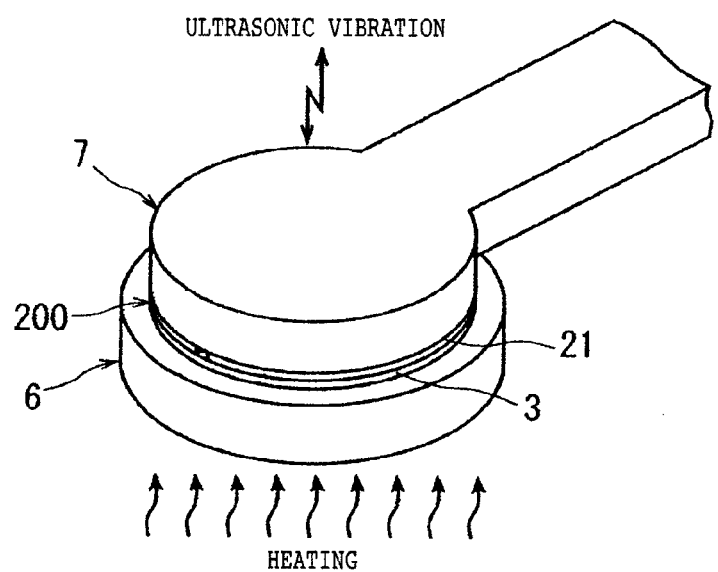
FIG. 12 is a perspective view for illustrating an eighth preferred embodiment of the optical device layer transferring step.

An eighth preferred embodiment of the optical device layer transferring step will now be described with reference to FIG. 12. In the eighth preferred embodiment shown in FIG. 12, the transfer substrate 3 of the composite substrate 200 processed by the buffer layer breaking step is placed on a holding table 6, and suction means (not shown) connected to the holding table 6 is operated to hold the composite substrate 200 on the holding table 6 under suction. Thereafter, the lower surface (suction holding surface) of a suction pad 7 is placed on the back side 21b of the epitaxy substrate 21 of the composite substrate 200 held on the holding table 6 under suction, and suction means (not shown) connected to the suction pad 7 is operated to hold the back side 21b of the epitaxy substrate 21 onto the lower surface (suction holding surface) of the suction pad 7 under suction. Thereafter, heating means (not shown) provided in the holding table 6 is operated to heat the composite substrate 200, and ultrasonic vibration applying means (not shown) provided in the suction pad 7 is operated to apply ultrasonic vibration to the back side 21b of the epitaxy substrate 21. Thereafter, the suction pad 7 is moved away from the holding table 6 to thereby easily peel the epitaxy substrate 21 from the optical device layer 22, thereby transferring the optical device layer 22 to the transfer substrate 3. While ultrasonic vibration is applied to the back side 21b of the epitaxy substrate 21 in this preferred embodiment, ultrasonic vibration may be applied to the transfer substrate 3 rather than the epitaxy substrate 21.

Figure 13:
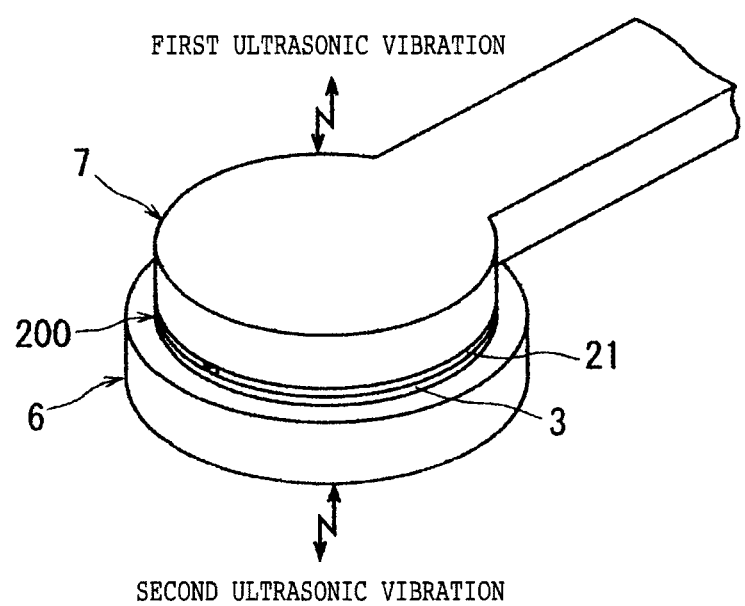
FIG. 13 is a perspective view for illustrating a ninth preferred embodiment of the optical device layer transferring step.

A ninth preferred embodiment of the optical device layer transferring step will now be described with reference to FIG. 13. In the ninth preferred embodiment shown in FIG. 13, the transfer substrate 3 of the composite substrate 200 processed by the buffer layer breaking step is placed on a holding table 6, and suction means (not shown) connected to the holding table 6 is operated to hold the composite substrate 200 on the holding table 6 under suction. Thereafter, the lower surface (suction holding surface) of a suction pad 7 is placed on the back side 21b of the epitaxy substrate 21 of the composite substrate 200 held on the holding table 6 under suction, and suction means (not shown) connected to the suction pad 7 is operated to hold the back side 21b of the epitaxy substrate 21 onto the lower surface (suction holding surface) of the suction pad 7 under suction. Thereafter, ultrasonic vibration applying means (not shown) provided in the suction pad 7 is operated to apply first ultrasonic vibration to the back side 21b of the epitaxy substrate 21, and ultrasonic vibration applying means (not shown) provided in the holding table 6 is operated to apply second ultrasonic vibration to the back side 3b of the transfer substrate 3.

The frequency of the first ultrasonic vibration to be applied to the back side 21b of the epitaxy substrate 21 is different from the frequency of the second ultrasonic vibration to be applied to the back side 3b of the transfer substrate 3. For example, the frequency of the first ultrasonic vibration to be applied to the back side 3b of the transfer substrate 3 is set to 20 kHz, whereas the frequency of the second ultrasonic vibration to be applied to the back side 21b of the epitaxy substrate 21 is set to 32 kHz. Thereafter, the suction pad 7 is moved away from the holding table 6 to thereby easily peel the epitaxy substrate 21 from the optical device layer 22, thereby transferring the optical device layer 22 to the transfer substrate 3. In this manner, the frequency of the first ultrasonic vibration to be applied to the back side 21b of the epitaxy substrate 21 is set different from the frequency of the second ultrasonic vibration to be applied to the back side 3b of the transfer substrate 3, thereby further improving the effect of peeling off the epitaxy substrate 21.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A lift-off method for transferring an optical device layer in an optical device wafer to a transfer substrate, said optical device layer being formed on a front side of an epitaxy substrate through a buffer layer, said lift-off method comprising:
    a transfer substrate bonding step of bonding said transfer substrate through a bonding layer to a front side of said optical device layer of said optical device wafer, thereby forming a composite substrate;
    a buffer layer breaking step of applying a pulsed laser beam having a wavelength transmissive to said epitaxy substrate and absorptive to said buffer layer from a back side of said epitaxy substrate to said buffer layer after performing said transfer substrate bonding step, thereby breaking said buffer layer; and
    an optical device layer transferring step of peeling said epitaxy substrate from said optical device layer after performing said buffer layer breaking step, thereby transferring said optical device layer to said transfer substrate;
    wherein ultrasonic vibration is applied to said composite substrate in performing said optical device layer transferring step.

2. The lift-off method according to claim 1, wherein said optical device layer transferring step comprises the steps of:
    applying ultrasonic vibration to at least one of said epitaxy substrate and said transfer substrate constituting said composite substrate;
    inserting a wedge into said buffer layer present at the boundary between said epitaxy substrate and said transfer substrate; and
    peeling said epitaxy substrate from said optical device layer to thereby transfer said optical device layer to said transfer substrate.

3. The lift-off method according to claim 1, wherein said optical device layer transferring step comprises the steps of:

applying first ultrasonic vibration to at least one of said epitaxy substrate and said transfer substrate constituting said composite substrate;
inserting a wedge into said buffer layer present at the boundary between said epitaxy substrate and said transfer substrate;
applying second ultrasonic vibration to said wedge; and
peeling said epitaxy substrate from said optical device layer to thereby transfer said optical device layer to said transfer substrate.

4. The lift-off method according to claim 3, wherein the frequency of said first ultrasonic vibration is set different from the frequency of said second ultrasonic vibration.

5. The lift-off method according to claim 1, wherein said optical device layer transferring step comprises the steps of:
inserting a wedge into said buffer layer present at the boundary between said epitaxy substrate and said transfer substrate constituting said composite substrate;
applying ultrasonic vibration to said wedge; and
peeling said epitaxy substrate from said optical device layer to thereby transfer said optical device layer to said transfer substrate.

6. The lift-off method according to claim 1, wherein said optical device layer transferring step comprises the steps of:
inserting a wedge into said buffer layer present at the boundary between said epitaxy substrate and said transfer substrate constituting said composite substrate, said wedge having a fine hole opening to a front end of said wedge;
issuing a jet of air from the front opening of said fine hole of said wedge;
applying ultrasonic vibration to said wedge; and
peeling said epitaxy substrate from said optical device layer to thereby transfer said optical device layer to said transfer substrate.

7. The lift-off method according to claim 1, wherein said optical device layer transferring step comprises the steps of:
inserting a wedge into said buffer layer present at the boundary between said epitaxy substrate and said transfer substrate constituting said composite substrate, said wedge having a fine hole opening to a front end of said wedge;
issuing a jet of water from the front opening of said fine hole of said wedge;
applying ultrasonic vibration to said wedge; and
peeling said epitaxy substrate from said optical device layer to thereby transfer said optical device layer to said transfer substrate.

8. The lift-off method according to claim 1, wherein said optical device layer transferring step comprises the steps of:
immersing said composite substrate in water;
applying ultrasonic vibration to said composite substrate; and
peeling said epitaxy substrate from said optical device layer to thereby transfer said optical device layer to said transfer substrate.

9. The lift-off method according to claim 1, wherein said optical device layer transferring step comprises the steps of:
heating said composite substrate;
applying ultrasonic vibration to at least one of said epitaxy substrate and said transfer substrate constituting said composite substrate; and
peeling said epitaxy substrate from said optical device layer to thereby transfer said optical device layer to said transfer substrate.

10. The lift-off method according to claim 1, wherein said optical device layer transferring step comprises the steps of:
applying first ultrasonic vibration to said epitaxy substrate constituting said composite substrate;
applying second ultrasonic vibration to said transfer substrate constituting said composite substrate; and
peeling said epitaxy substrate from said optical device layer to thereby transfer said optical device layer to said transfer substrate.

11. The lift-off method according to claim 10, wherein the frequency of said first ultrasonic vibration is set different from the frequency of said second ultrasonic vibration.

* * * * *